United States Patent [19]

Asmussen et al.

[11] Patent Number: 4,585,668

[45] Date of Patent: Apr. 29, 1986

[54] METHOD FOR TREATING A SURFACE WITH A MICROWAVE OR UHF PLASMA AND IMPROVED APPARATUS

[75] Inventors: Jes Asmussen, Okemos; Donnie K. Reinhard, East Lansing, both of Mich.

[73] Assignee: Michigan State University, East Lansing, Mich.

[21] Appl. No.: 641,190

[22] Filed: Aug. 16, 1984

Related U.S. Application Data

[63] Continuation-in-part of Ser. No. 468,897, Feb. 28, 1983, Pat. No. 4,507,588.

[51] Int. Cl.$^4$ .............................................. B05D 3/06
[52] U.S. Cl. ..................................... 427/38; 427/45.1; 427/86
[58] Field of Search ........................... 427/38, 45.1, 86

[56] References Cited

U.S. PATENT DOCUMENTS

| | | |
|---|---|---|
| 3,757,733 | 9/1973 | Reinberg . |
| 4,170,662 | 10/1979 | Weiss et al. ........................... 427/38 |
| 4,282,267 | 8/1981 | Küyel .................................... 427/38 |
| 4,443,488 | 4/1984 | Little et al. ........................... 427/38 |
| 4,452,679 | 6/1984 | Dunn et al. ......................... 204/164 |
| 4,481,229 | 11/1984 | Suzuki et al. ........................ 427/38 |

OTHER PUBLICATIONS

Sze, S. M., VLSI Technology, McGraw Hill, New York (1983) Chapters, 3, 4 and 8.
Suzuki, K. S. et al, "Microwave Plasma Etching" 16, 1979-1984 (1977)—Japanese J. Appl. Phys.
Suzuki, K. et al, "Microwave Plasma Etching" Proc. Int'l Ion Engineering Congress ISIAT '83 & IPAT '83, 1645-1656 (1983).
Electronics, p. 63, Nov. 20, 1980.
MacDonald, A. D. et al, "High Frequency and Microwave Discharges" in Gaseous Electronics, M. N. Hirsch et al eds., vol. I Academic Pr. N.Y. (1978) Chap. 3.
Ligenza, J. R., "Silicon Oxidation in an Oxygen Plasma Excited by Microwaves," J. Appl. Phys., 36, 2703-2707 (1965).
Gourrier, S., et al, "Review of Oxide Formation in a Plasma", Plasma Chemistry and Plasma Processing, 1, 217-232 (1981).
Katz, L. E., "Oxidation", Chapter 4 in VLSI Technology, S. M. Sze editor, Wiley, New York, (1983).
Ho, V. Q. et al, "Selective Anodic Oxidation of Silicon in Oxygen Plasma", IEEE Tran. Elect. Dev., ED-27, 1436-1443, (1980).
Weinreich, O. A., "Oxide Films Grown on GaAs in an Oxygen Plasma", J. Appl. Physics, 37, 2924, (1966).
Chang, R. P. H. and A. K. Sinha, "Plasma Oxidation of GaAs", Appl. Phys. Lett, 29, 56-58 (1976).
Sugono, T., F. Koshiga, K. Yamasolci, and S. Takahashi, "Application of Anodization in Oxygen Plasma to Fabrication of GaAs IGFET's", IEEE Tran. Elect Dev., ED-27, 449-455 (1980).

*Primary Examiner*—Thurman K. Page
*Attorney, Agent, or Firm*—Ian C. McLeod

[57] ABSTRACT

A method for etching or chemically treating a surface of an article utilizing a radio frequency wave ion generating apparatus which provides a thin disk shaped plasma is described. The plasma disks can have a relatively large diameter (on the order of magnitude 50 centimeters). The plasma disks can be created without using a static magnetic field. The radio frequency waves are preferably microwaves or UHF. The method is particularly useful for ion or free radical irradiation of the surface provided in the plasma or for irradiation of the surface by ions accelerated outside a cavity containing the plasma. Disk plasmas are created over a wide pressure range ($10^{-4}$ Torr to 1 atmosphere) and are highly ionized at low pressures. An apparatus adapted for treating a surface of an article with ions from a plasma is also described. The method and apparatus are preferably used for treating a surface forming part of an integrated circuit.

16 Claims, 5 Drawing Figures

METHOD FOR TREATING A SURFACE WITH A MICROWAVE OR UHF PLASMA AND IMPROVED APPARATUS

This application is a continuation-in-part of U.S. application Ser. no. 468,897 filed Feb. 28, 1983, now U.S. Pat. No. 4,507,588.

BACKGROUND OF THE INVENTION

1. Field of the Invention

The present invention relates to a method for treating a surface using a plasma generated by radio frequency wave source, particularly a microwave or UHF source of energy. In particular, the present invention relates to a method which utilizes a disk shaped plasma allowing etching, texturing, vapor deposition and oxidation of the surface. The present invention also relates to an apparatus for treating the surface of an article, such as an integrated circuit.

In U.S. application Ser. No. 468,897 filed Feb. 23, 1983 now U.S. Pat. No. 4,507,588, including one of the present inventors, a microwave ion source apparatus is described which is useful for large surface area treatment. This apparatus produces a microwave plasma over the surface being processed. The plasma has a disk shape and hence the name microwave plasma disk reactor. It can be operated continuously from high pressures (over one atmosphere) to low ($<10^{-3}$ Torr) pressures in any gas, and is particularly adaptable to many different conditions. This allows the optimization of a given process. In particular input power, gas flow, pressure, and the like can be accurately controlled through large variations, witn a sustained plasma. The present invention is an outgrowth of this earlier application.

2. Prior Art

The high density requirement of VLSI (Very Large Scale Integration) technology has provided a driving force for the application of plasma processing to integrated circuit (IC) fabrication. Current and potential uses of plasma assisted semiconductor wafer processing include oxidation, film deposition, and dry etching procedures (Sze, S.M., *VLSI Technology*, McGraw Hill, New York (1983)). All of these offer advantages to VLSI processing because of one or more of several factors, including anisotropic properties, low temperature which leads to small wafer thermal stress, or improved material quality. Heretofore most IC plasma processing has been carried out with dc or rf generated plasmas (less than or equal to 60 megahertz). However, microwave induced plasmas possess several advantages and several researchers have suggested the investigation of the effect of higher frequencies on plasma processing.

Until recently, with the exception of early work on plasma growth of native oxides in silicon, few experiments have investigated microwave plasma IC processing. Primarily, this is because microwave discharges usually have small volumes and, particularly, small surface areas. On the other hand, microwave discharges have several positive attributes for semiconductor processing. For example, microwave generated plasmas allow higher plasma densities at lower pressures when compared to rf or dc plasmas. A substantially greater degree of anisotropic etching, and therefore high circuit density, should therefore be possible by processing with microwave plasmas. Some Japanese experimental work with microwave discharges appears to confirm this expectation (Suzuki, K. S., S. Okudaira, N. Sadudo and I. Kanomata, "Microwave Plasma Etching," 16, 1979-1984 (1977); Suzuki, K., S. Nishimatsu, K. Ninomiya and S. Okudaira, "Microwave Plasma Etching," Proc. Int'l Ion Engineering Congress ISIAT '83 & IPAT '83, 1645-1656 (1983)) and, in fact, Hitachi has recently introduced a microwave plasma etching system for commercial use (Electronics, p. 63, Nov. 20, 1980). Also microwave plasmas, as is the case for rf but not dc, may be electrodeless which reduces a source of contamination, reduces maintenance and increases lifetime. Microwave systems are of comparatively low cost, are simple to operate, and are usually more efficient than dc or rf plasmas. By moving into the higher frequency range, more excited atomic states and more free radicals are present in the plasma.

MICROWAVE PLASMAS

This invention concerns itself with the development of microwave plasma reactors for materials processing. Microwave discharges have been studied for over thirty years. They first appeared as unwanted gaseous breakdown inside waveguide and coaxial coupling structures. An early application was the TR tube which involved igniting a small microwave discharge in a waveguide (MacDonald, A. D. and S. J. Tetenbaum, "High Frequency and Microwave Discharges," in *Gaseous Electronics*, M. N. Hirsch and H. J. Oskam, eds., Vol. I, Academic Press, New York (1978)). As a result, initial theoretical and experimental studies focused on understanding the microwave breakdown process. Most early experimental discharges had small plasma volumes and thus future applications did not appear promising. Yet, over the last twenty years many microwave discharge applications have been and continue to be studied. Examples are frequency converters and harmonic generators, ion and free radical sources, synthesis of chemicals, spectral radiation sources, heat sources, and electric propulsion systems for space applications, i.e. microwave ion engines and microwave electrothermal engines.

When considering plasma processing applications, microwave discharges have a number of potentially important advantages over lower frequency rf and dc glow discharges. For example, microwave discharges are very "chemically active" and can be efficiently maintained over a wide range of operating pressures. They are electrodeless discharges which are simple to operate and have low equipment costs.

The lack of metal electrodes in the discharge zone removes a possible source of chemical contamination and allows the use of chemically active gases that cannot be easily used in discharges with metal electrodes. It also has the very practical advantage of being able to quickly cycle the discharge system to atmosphere air (or other atmospheric gas) between processing steps or runs. Discharge system life times are lengthened and allowable discharge intensities can be increased when electrodes are absent. These attributes, also shared by electrodeless rf generated plasmas, are usually important advantages in plasma processing applications. However, at present, a microwave plasma reactor with the processing versatility that is comparable with dc plasma, barrel reactor and rf parallel plate processing technologies does not exist. This invention addresses the lack of such a versatile microwave plasma reactor by using a microwave plasma disk source.

Work in both plasma assisted etching and plasma assisted oxidation dates back to the 1960's. Plasma assisted etching has since become a key processing technology. The plasma assisted growth of native oxides, on the other hand, has not achieved widespread use to date. This difference is primarily due to the historical development of requirements for silicon wafer processing. Specifically, the need to etch Si3N4, followed by the fine line width requirements of VLSI, provided a strong impetus for the development of plasma etching techniques. The motivation for development of plasma oxidation has been less strong, due to the high quality of presently available thermally grown oxides. Currently, however, there is renewed interest in plasma assisted oxidation for two reasons. First it is a low temperature process. This is an extremely advantageous feature for VLSI because of the corresponding reduction of wafer warpage and impurity motion. Secondly, there is appreciable interest in III–V compounds for which thermally grown oxides are not of high quality. In both cases, plasma grown oxides offer a potential advantage.

Plasma Assisted Oxidation of Silicon

Plasma oxidation of silicon was reported by Ligenza in 1964 (Ligenza, J. R., "Silicon Oxidation in an Oxygen Plasma Excited by Microwaves," J. Appl. Phys., 36, 2703–2707 (1965)). An oxide growth rate of 6000 Angstroms in one hour at temperature below 300° C. was observed in a microwave generated oxygen plasma. Basic features of Ligenza's results were confirmed by several groups, although the exact mechanisms for plasma assisted oxidation are still debated. The importance of a positive bias on the silicon leads to the conjecture that $O^-$ ions play a critical role. Later work using ion analysis confirms this hypothesis. Subsequent investigations showed that similar results could be observed in rf (using frequencies from 420 KHz to 30 MHz) induced oxygen plasmas and dc arc oxygen plasmas. A review of oxide formation in plasmas up to 1980 has been published by Gourrier and Bacal (Gourrier, S., and M. Bacal, "Review of Oxide Formation in a Plasma," Plasma Chemistry and Plasma Processing, 1, 217–232, (1981)). Regardless of the frequency, the method is often referred to as "anodic-plasma oxidation" (Katz, L. E., "Oxidation," Chapter 4 in *VLSI Technology*, S. M. Sze, editor, Wiley, New York (1983)). Recent oxidation experiments indicate that with careful control of experimental parameters, high quality oxide films can be grown with plasma systems.

The above review supports the conclusion by Katz, in his review chapter, that anodic plasma oxidation offers great potential (Katz, L. E., "Oxidation," Chapter 4 in *VLSI Technology*, S. M. Sze, editor, Wiley, New York, (1983)). He further states that uses should proliferate when commercial equipment becomes available.

Low temperature plasma grown SiO2 can be used for less-critical applications such as passivation, as grown. And with an appropriate low temperature anneal at least one reported oxide film (Ho and Sugano (Ho, V. Q. and T. Sugono, "Selective Anodic Oxidation of Silicon in Oxygen Plasma," IEEE Tran. Elect. Dev., ED-27, 1436–1443, (1980)) appears suitable for critical applications such as gate oxides.

Plasma Assisted Oxidation of III–V Compounds

Plasma assisted growth of native oxides on high mobility III–V compounds is another area of commercial concern particularly for InP. The problem in forming an insulator, suitable for MISFET applications, on the surfaces of III–V compounds is well known and of long standing. Thermally grown oxides are generally of poor quality due to the widely differing vapor pressures of the oxide constituents. Consequently, alternative approaches such as anodic electrolytic oxidation and anodic plasma oxidation are of interest.

Weinreich reported low temperature oxidation of GaAs in 1966 using a microwave oxygen plasma (Weinreich, O. A., "Oxide Films Grown on GaAs in an Oxygen Plasma," J. Appl. Physics, 37, 2924, (1966)) and several other investigators have since studied plasma grown oxides on GaAs (Chang, R. P. H. and A. K. Sinha, "Plasma Oxidation of GaAs," Appl. Phys. Lett, 29, 56–58, (1976); Sugono, T., F. Koshiga, K. Yamasolci, and S. Takahashi, "Application of Anodization in Oxygen Plasma to Fabrication of GaAs IGFET's," IEEE Tran. Elect Dev., ED-27, 449–455, (1980)). Appreciable progress has been made and indeed planar GaAs MOSFET integrated circuit ring oscillators with enhancement/depletion mode gates have been reported, with anodic plasma oxide gates (Yokoyoma, N., T. Mimura, and M. Fukata, "Plasma GaAs MOSFET integrated Logic," ED-27, 1124–1128, (1980). However GaAs is rather handicapped by a high density of surface states which pin the Fermi energy near the middle of the band gap for both metal-semiconductor and MIS systems (Wieder, H. H., "Materials Options for Field Effect Transistors," J. Vac. Sci. Technol., 18, 827–837, (1981). Therefore enhancement mode MOSFET's are difficult to fabricate. InP, however, has an appreciably lower surface state concentration, and enhancement mode MISFET's have been reported by several groups (Lile, D. L., D. A. Collins, L. G. Meiners, and L. Messich, "N-channel Inversion Mode InP MISFET," Electron. Lett., 14, 657–659, (1978); Henry, L., D. LeCrosnier, H. L'Haridon, J. Paugam, G. Pelous, F. Richou, M. Salvi, "N-Channel MISFET's on Semi-Insulating InP for Logic Applications," Electron. Lett., 18, 102–103 (1982)). The first plasma grown native oxide on InP was reported in 1981 by Kanazawa and Matsunami (Kangawa, K. and H. Matsunami, "Plasma Grown Oxide on InP," Japanese J. Appl. Phys, 20, L211–L213, (1981)). Capacitance-voltage measurements on their inductively coupled rf plasma grown MOS structure show a minimum surface density in the range $1^{-3} \times 10^{11}$ cm$^{-2}$ev$^{-1}$. This is comparable to electrolytically grown oxides on InP. These results are promising, but further improvements would be in order. The plasma grown films seem to have a pile-up of P near the interface and a deficiency of P in the oxide. (However the deficiency is less than in thermally grown InP oxides). Also a hysterisis was observed in the C-V measurements. This was reduced on a $H_2$ anneal, but after the anneal the oxide was leaky.

The possibility of high mobility, enhancement mode MOSFET InP integrated circuits is attractive. Plasma grown native oxides offer an interesting fabrication possibility for the gate insulator.

Plasma Assisted Etching

Etching of a semiconductor substrate takes place due to a combination of physical and chemical processes. The processes are due mainly to ions, neutral particles and in an indirect way electrons. Plasma etching reactors are designed to encourage certain reactions while inhibiting others, and this has led to several different reactor designs. For example the degree of anisotropic etching is one parameter which is strongly influenced by reactor design.

Before discussing different reactor designs, it is useful to consider the etching of silicon in a $CF_4$ plasma as a case in point. The chemically active neutral species in the plasma is F, and the simplified steps in the process are as below (Colburn, J. W. and H. F. Winters, "Plasma-Etching-A Discussion of Mechanisms," J. Vac. Sci. Technol., 16, 391–403, (1979)).

$$\text{Chemisorption } (F_2)_{gas} \rightarrow (F_2)_{ads} \rightarrow 2F_{ads}$$

$$\text{Reaction } Si + 4F_{ads} \rightarrow (SiF_4)_{ads}$$

$$\text{Desorption } (SiF_4)_{ads} \rightarrow (SiF_4)_{gas}$$

It is well known that the etch rate increases rapidly when energetic ions are incident on the wafer. A possible explanation is that ions cause damage sites on the silicon surface which enhances the dissociative chemisorption of $F_2$ (Colburn, J. W. and H. F. Winters, "Plasma-etching—A Discussion of Mechanisms," J. Vac. Sci. Technol., 16 391–403, (1979)). Therefore, if ions are normally incident on the wafer the lateral etching of sidewalls proceeds at a much lower rate than is the case for the horizontal wafer surfaces. Consequently, the etching is anisotropic, or directional, or vertical, all of which are terms used rather interchangeably in the literature.

The more normally incident the ions are, the more directional is the etching. Therefore low plasma pressures are favored for anisotropic-etching since ions are scattered at high pressures. However, in conventional rf and dc plasmas, etch rates are greatly reduced at low pressure due to low plasma densities so there is a trade-off between etch rate and anisotropic etching. Alternatively, in conventional systems, anisotropic etching can be increased at higher pressures by increasing the energy of the incident ions. In this case the cost involves semiconductor damage and loss of selectivity.

The design of a particular reactor, then, depends on what feature is being emphasized. For example, consider the following types.

(i) Barrel reactor. Here the wafers are not in direct contact with the rf discharge, but rather in a perforated metal tunnel which is surrounded by the discharge. The surface potential of the wafers is not much different than the surrounding glow, so ion bombardment is not appreciable and etching is due primarily to long lived radicals. Operating pressures are typically high, on the order of 200 m Torr, and etching is generally isotropic. The approach is well suited for multiple wafer processing, but uniformity problems require overetching (Elliott, D. J., *Integrated Circuit Technology*, Chapter 11, McGraw-Hill, (1982)).

(ii) Parallel plate reactor. In this design, also known as the Reinberg reactor, the wafers are on one plate of a diode plasma system, and in direct contact with the plasma (Reinberg, A. R., "Radial Flow Reactor," U.S. Pat. No. 3,757,733 (1973)). Since the sheath potential is on the order of one-fourth the applied rf peak to peak voltage, and therefore in the range of 75 to 250 v., ion bombardment may be significant. Also short lived radicals take part in the etching in this configuration. Both barrel and plasmas reactors have received widespread commercial use, with the latter offering improved etch uniformity and the possibility of anisotropic etching.

(iii) Reactive Ion Etching (RIE) and Reactive Ion Beam Etching (RIBE). Reactive ion etching, also known as reactive sputter etching, often employs apparatus similar to sputtering chambers with the wafer taking the place of the target. Compared to the parallel plate reactor, RIE systems are characterized by generally lower pressures (10 m Torr–100 m Torr) and higher substrate potentials. These combine to produce highly anisotropic etching. In a report by Lin, et al., a magnetic field was used to achieve a magnetron RIE system (Lin, I., D. C. Hinson, W. H. Class, and R. L. Sandstrom, "Low Energy High Flux Reactive Ion Etching by R. F. Magnetron Plasma," Appl Phys. Lett., 44, 185–187, (1981)). Reactive ion beam etching, on the other hand, employs apparatus similar to that used for ion beam milling (Bollinger, L. D., "Ion Beam Etching with Reactive Gases," Solid State Technology, 26, 99–108, January 1983)). Whereas ion beam milling uses inert gases, such as argon, RIBE employs reactive gases. It offers the possibility of controlling the angle of ion incidence and is operated at quite low pressure levels, in the range of $1 \times 10^{-4}$ Torr. Consequently a very high degree of etching anistropy is achievable. The method also differs from RIE in that the wafer is not in actual exposure to the discharge. Therefore there is little interaction with atoms in short lived, excited states.

(iv) Recent Developments. Geis, et al., (Geis, M. W., G. A. Lincoln. N. Efreomow, and W. J. Piacentini, "A Novel Anisotropic dry etching Technique," J. Vac. Sci. Technol. 19, 1390–1393, (1981)) reported a variation on RIBE in which a Kaufman ion source is used to direct an argon beam onto a wafer, and also impinging a chemically reactive gas from a jet near the wafer. This allows a larger flux of reactive gas than in conventional RIBE. Chinn, et al., refer to the method as chemical assisted ion beam etching and have reported etching, of GaAs, Ti, Si, and Mo using similar apparatus (Chinn, J. D., A Fernandez, I. Adesida, and E. D. Wolf, "Chemically Assisted Ion Beam Etching of GaAs, Ti, and Mo," J. Vac. Sci. Technol, A1, 701–704, (1983); Chinn, J. D., I. Adesida, and E. D. Wolf, "Profile Control of Chemically Assisted Ion Beam and Reactive Ion Beam Etching," Appl. Phys. Lett, 43, 185–187, (1983)). Another approach aimed at improved control of ion bombardment is triode plasma etching, as reported by Minkiewicz and Chapman (Minkiewicz, V. J. and B. N. Chapman, "Triode Plasma Etching," Appl. Phys. Lett. 34, 192 (1979)). Here the substrate holder is based separately from the two electrodes which sustain the discharge, but the substrate is still in contact with the plasma. Improved control of the etch profile is reported. More recently, Mantei and Wicker reported a triode like system with surface magnetic field confinement (T. D. Mantei and T. Wicker, "Plasma Etching with Surface Magnetic Field Confinement," Appl. Phys. Lett. 43, 84 (1983)).

OBJECTS

It is therefore an object to provide an improved method for surface treatment, for example integrated circuit formation, including etching, deposition and oxidation. Further still, it is an object to provide a method which is relatively simple to perform and which is economical, reliable and produces excellent results. These and other objects will become increasingly apparent by reference to the following description and the drawings.

IN THE DRAWINGS

GENERAL DESCRIPTION

Figure 1:
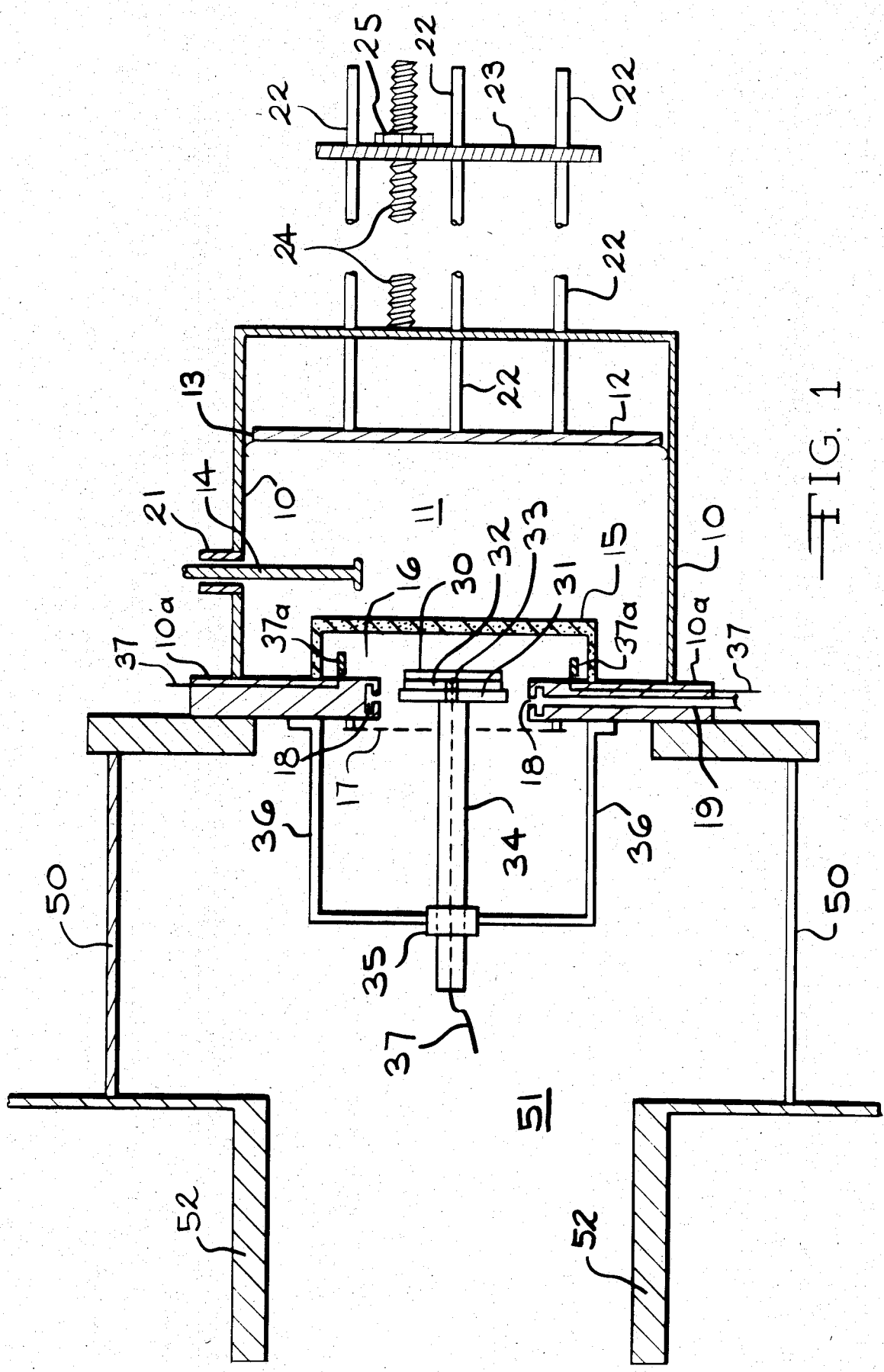
FIG. 1 shows the improved apparatus of the present invention adapted for treatment of a surface (30) forming part of an integrated circuit, wherein the surface being treated is exposed to a disk shaped plasma and is directly biased by a wire (37) with a voltage during the treatment, and is mounted on an adjustable stand (31, 34) by a sleeve (35).

The present invention relates to a method for treating a surface forming part of an integrated circuit which comprises: providing an ion generating apparatus including a plasma source employing a radio frequency, including UHF or microwave, wave coupler which is excited in one or more of its TE or TM modes of resonance and optionally including a static magnetic field surrounding the plasma source which aids in coupling at electron cyclotron resonance and aids in confining the ions in the coupler wherein the plasma is maintained at a reduced pressure in operation wherein the ion source apparatus includes an electrically insulated chamber (15) mounted in closely spaced relationshp to an area (16) of a metallic radio frequency wave coupler, and gas supply means (18, 19) for providing a gas which is ionized to form the plasma in the insulated chamber with the surface of the integrated circuit in position to receive the ions; forming a plasma disk in the chamber; and contacting a surface of the article with the ions or free radicals inside the plasma or with ions or neutralized ions removed from the plasma which treat the surface, wherein the surface has a suitable voltage potential.

The present invention also relates to a method for treating a surface which comprises: providing an ion generating apparatus including a plasma source employing a radio frequency, including UHF and microwave wave coupler which is excited in one or more of its TE or TM modes of resonance and optionally including a magnetic field which aids coupling at electron cyclotron resonance and aids in confining the ions in the coupler wherein the plasma is maintained at a reduced pressure in operation, wherein the ion source apparatus includes an electrically insulated chamber (15) mounted in closely spaced relationship to an area (16) of a metallic radio frequency wave coupler, and gas supply means (18, 19) for providing a gas which is ionized to form the plasma in the insulated chamber with the surface of the integrated circuit in position to receive the ions; forming a plasma disk in the chamber and attracting the ions to the surface with a bias means having a suitable voltage potential attached to the surface which treat the surface.

The present invention also relates to an ion generating apparatus for treating a surface of an article which comprises:

(a) a plasma source employing a radio frequency, including UHF or microwave, wave coupler which is excited in one or more of its TE or TM modes of resonance and optionally including a magnetic field which aids in coupling at electron cyclotron resonance and aids in confining the ions in the coupler wherein the plasma is maintained at a reduced pressure in operation wherein the ion source apparatus includes an electrically insulated chamber (15) mounted in closely spaced relationship to an area (16) of a metallic radio frequency wave coupler;

(b) gas supply means (18, 19) for providing a gas which is ionized to form the plasma in the insulated chamber;

(c) ion attracting means (37) for attachment to the surface for attracting ions from the plasma to the surface by means of a suitable voltage potential; and (d) a platform (31) supporting the surface and electrically insulated from the ion attracting means.

SPECIFIC DESCRIPTION

FIG. 1 shows the preferred plasma generation apparatus of the present invention, some of which has elements in common with U.S. Ser. No. 468,897. The principle components of the apparatus are displayed in the cross-sectional view of FIG. 1. The system, constructed to be operated at 2.4 gigaHertz, consists of a 17.8 cm inside diameter brass cylinder walls 10 forming the microwave cavity 11. A sliding short 12, with brushes 13 contacts cylinder 10 and the adjustable excitation probe 14, provide the impedance tuning required to minimize reflected power. The sliding short 12 can be moved back and forth along the longitudinal axis of the cavity 11 to adjust its electrical length while the radial penetration of the excitation probe 14 into the cylinder walls 10 varies the cavity 11 mode coupling. A quartz dish 15 is shaped like a petri dish and keeps the working gas in region or chamber 16 while allowing the microwave power to produce a disk-like plasma adjacent to the field shorting screen 17. The working gas is introduced into region 16 by means of an annular recess 18 in a base plate 10a, supplied by gas feed tube 19. A conduit 21 is provided as a microwave inlet port to the cavity 11 for probe 14. The short 12 is adjusted by means of rods 22 supported by plate 23 outside the cylinder walls 10 controlled by threaded post 24 and nut 25. This design source minimizes the plasma volume by creating a thin disk-like plasma adjacent to the field shorting screen 17. The charged particles, i.e. electrons and ions, in the disk plasma and the screen 17 form part of a resonant microwave cavity.

Figure 2:
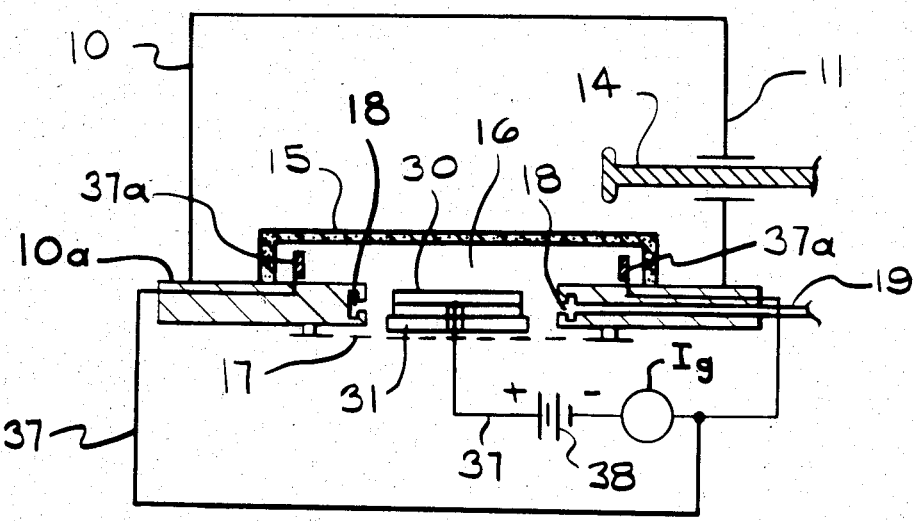
FIG. 2 is a diagram of the biasing circuit used with the apparatus of the present invention showing the direct biasing of the integrated circuit surface (30) being treated.

The wafer 30 being treated is mounted on a stainless steel platform 31 which is insulated by a quartz disk 32 having a hole 33 therethrough. The platform 31 is mounted on a hollow tube 34 which is secured in position by an sleeve 35 and holding brackets 36 so that the vertical height of the platform 31 can be adjusted relative to the dish 15. A bias wire 37 is provided through the tube 34 and hole 33 and is in electrical contact with the wafer 30 and insulated from the platform 31, tube 34 and sleeve 35. The apparatus is mounted in a vacuum bell jar 50 with an opening 51 in a conduit 52 leading to a vacuum pump (not shown). As shown in FIG. 2, the bias wire 37 is connected to a voltage power supply 38. The field shorting screen 17 is electrically connected to the cavity 10. It will be appreciated that the wafer 30 can be clamped (not shown) on a conductive surface biased by wire 37. This allows faster treatment of the wafers 30. All of these variations will be obvious to one skilled in the art. Also the disk 15 can be provided with silicon semi-conductor electrodes 37a inside chamber 16 through base plate 10a. The electrodes 37a prevent contamination of the plasma reactions with metallic electrode materials.

Figure 3:
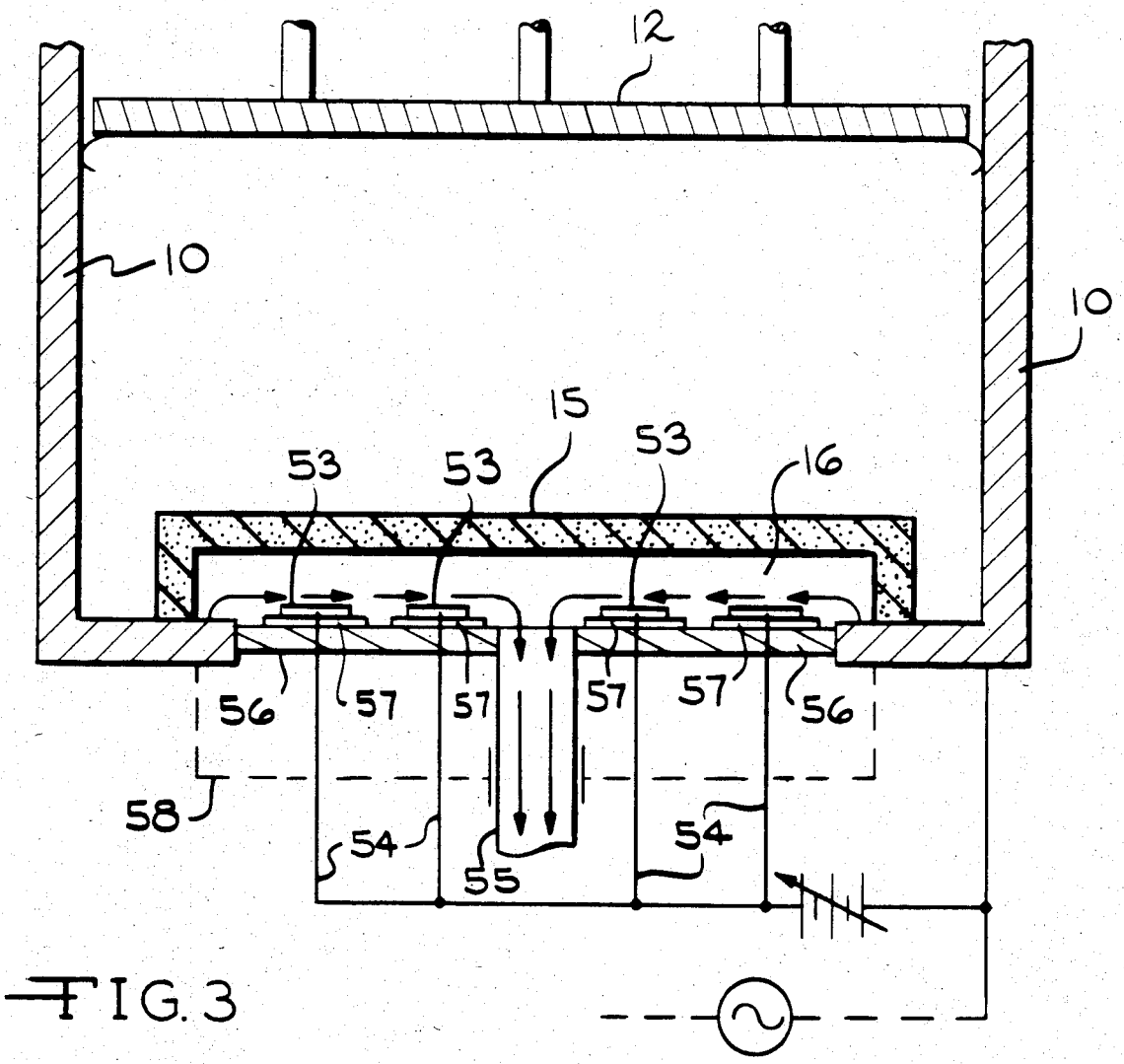
FIG. 3 is a schematic front cross-sectional view of another embodiment of plasma treating apparatus, of the present invention wherein the chamber (16) contains a wide disc shaped plasma (as large as 50 cm) for treatment of multiple wafers (53) or other articles and particularly showing a central passage or conduit (55) which allows gas to be removed from a plasma chamber (16).

FIG. 3 shows that a large diameter plasma disk can be created in chamber 16 for processing multiple wafers 53. For instance by changing the cavity resonant frequency to 915 megaHertz and by increasing the chamber 16 diameter, plasma disks of larger diameter (e.g. 50 cm) can be created.

Figure 5:
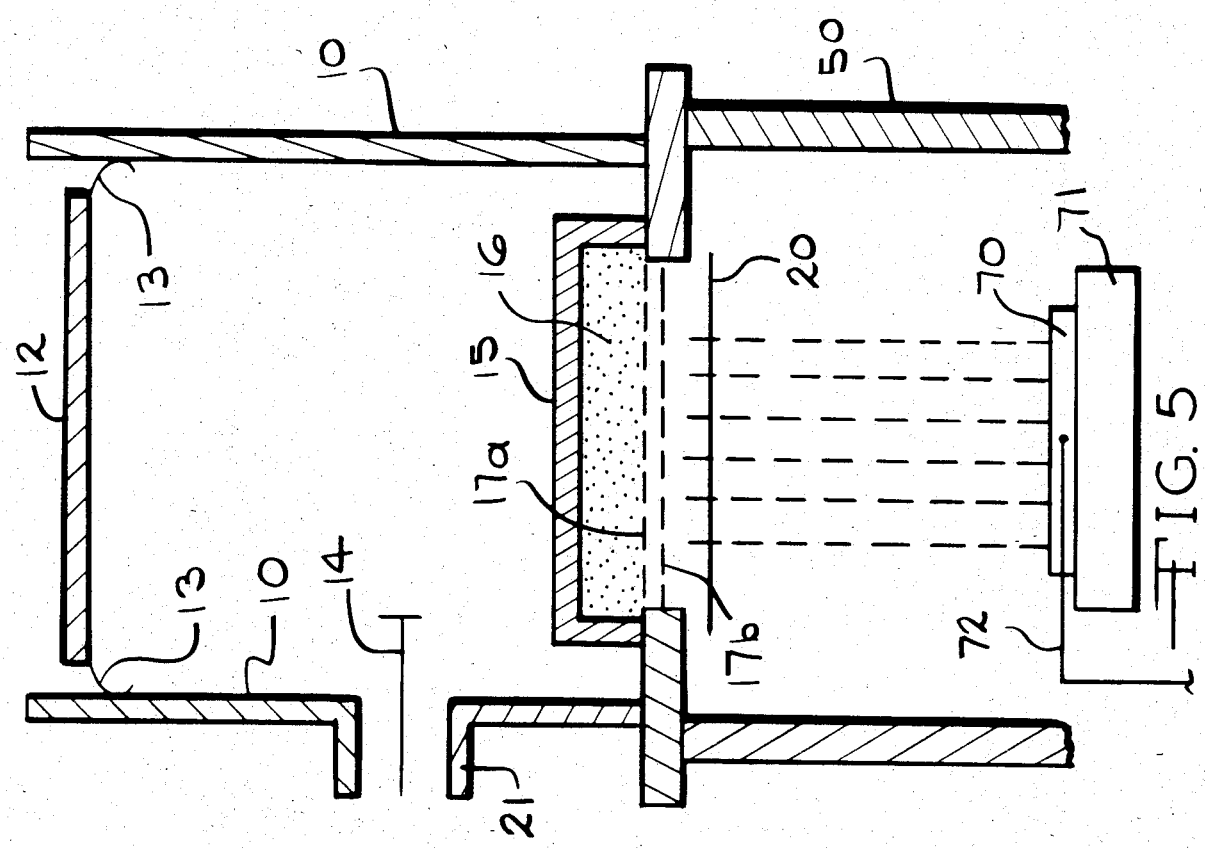
FIGS. 4 and 5 are schematic front cross-sectional views showing other embodiments of the apparatus wherein the ions are either inside the chamber (16) with the disk plasma or outside the chamber (16).
Figure 4:
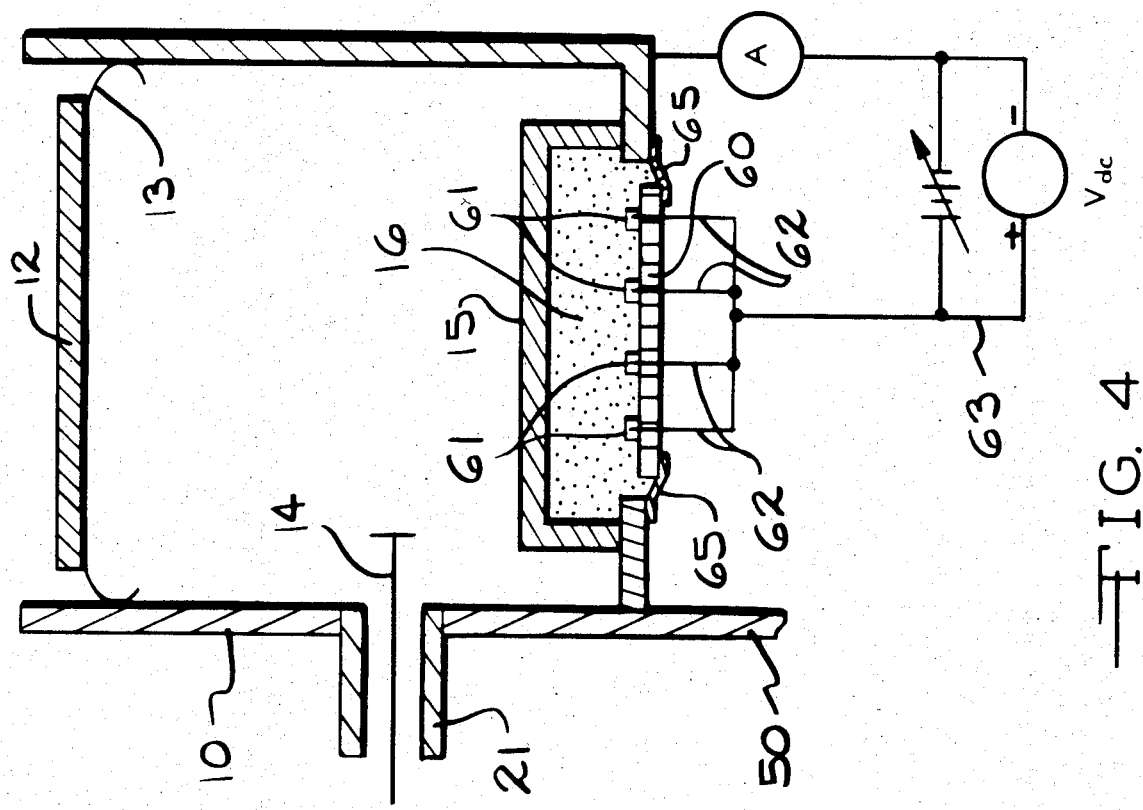

As can be seen from FIG. 3, multiple wafers 53 are biased by wires 54. The gas is allowed to flow across the wafers 53 and out central conduit 55 to be removed by vacuum system (not shown) since the flows are small. The wafers are supported on platforms 56 which form part of the microwave cavity and are insulated by a quartz disks 57. Alternatively the platforms 56 can be insulating and support the wafers 53 and a field shorting screen 58 forms part of the microwave cavity. As can be seen from FIG. 4, a grid 60 is provided and multiple wafers 61 are biased by wires 62 and circuit 63. Supports 65 hold the grid 60 in place. As in FIGS. 1 and 3 the wafers 61 are insulated by quartz disks. In FIG. 5 wafer 70 is positioned outside of the chamber 15 on an insulated support 71 and biased by wire 72. Grids 17a and 17b are biased to attract the ions from the chamber, as described in Ser. No. 468,897. The filament 20 can be used to neutralize electrons as does the neutralizer 20 described in U.S. Pat. No. 4,507,588. FIGS. 3 to 5 include a gas supply means as in FIG. 1 which is not shown.

The experimental microwave circuit used with the reactor is described in Ser. No. 468,897. It consists of (1) a 2.45 GHz, cw variable power source, (2) a circulator and matched dummy load, (3) directional couplers and power meters that measure incident power, $P_i$, and reflected power $P_r$, (4) the coaxial coupling probe and dc block (when needed) and (5) the cavity 10 itself.

Several small 17.8 cm diameter reactors were built and tested with the inert gases, $O_2$, $H_2$ and gas mixtures. In all gases a 10 cm diameter plasma disk could be continually maintained inside the cavity from pressures as low as $10^{-4}$ Torr to over one atmosphere. This is a much wider operating pressure range than other microwave, rf and dc plasma reactors. Depending on the plasma/gas loading, input power varies between tens of watts to over 1,000 W. In all cases the reactor can be well matched for efficient operation, i.e. power reflected from the plasma/cavity was less than 3% of the incident power. The probe and length tuning can be automated with gearing and small motors. Electron density measurements made in argon gas with input microwave powers of 80 W to 150 W at pressures of $5 \times 10^{-4} - 10 \times 10^{-3}$ Torr with double Langmuir probes indicate densities of $5 \times 10^{12} - 10^{13}/cm^3$ in the disk discharge region. These are at least an order of magnitude higher than those measured in other plasma and microwave reactors.

The apparatus shown in FIGS. 1 and 2 was operated to carry out an oxidation of Si wafers. Preliminary oxidation experiments with positive dc current bias in a $O_2$ plasma have been carried out with 5 cm and 2.5 cm Si wafers, demonstrating the feasibility of oxidation with this system. It can also be used for thin film processing such as for silane decomposition to deposit silicon or for surface texturing for optical or metal treatment purposes.

The potential general advantages of a microwave discharge is a chemically active electrodeless discharge that has low equipment costs and is simple to operate. Additional advantages appear when one investigates specific applications of the microwave plasma disk reactor. The strengths of this reactor are discussed below for its application to plasma oxidation and etching.

The specific advantages of the reactor for plasma oxidation can be grouped into two categories; those concerned with (1) efficiency, and (2) experimental (and processing) versatility. The reactor requires no additional tuning stubs or other equipment to couple (i.e. match) microwave energy into the reactor cavity over a large pressure range (preferably $10^{-4}$ Torr to one-half atmosphere). Once microwave energy is in the cavity, the efficiency of coupling into the plasma is high, especially for high density ($\geq 10^{11}/cm^3$) operation. The plasma volume may be adjusted by varying the quartz disk size and platform positions. The plasma is only created in a thin layer over the surface being processed and extra plasma volume requiring extra power is not produced. Thus, the available input power requirements and associated energy and equipment costs are reduced. This is, of course, important for a process such as plasma oxidation where energy requirements appear to be large even for small wafers.

Experimental versatility is evidenced by the ability to scale to large plasma disks allowing large wafer and multiple wafer treatment. This versatility is also evidenced by the ability to operate a high density oxygen plasma over a wide range of pressures ($10^{-4}$ Torr to 10 Torr) and flow rates by simply adjusting the input power. The substrate is easily biased relative to the plasma. Since high density ($\geq 10^{12}/cm^3$) discharges can be produced without a magnetic field, it appears that fast electrons (which are produced by electron cyclotron resonance discharges (Loncar, G., J. Musil and L. Bardos, "Present States of Thin Oxide Films Creation in a Microwave Plasma," Czech. J. Phys. B30, 688–707, (1980)) will not be generated. Thus, oxide films that are undamaged by fast electrons should result.

The above mentioned advantages indicating good efficiency and versatility apply also to etching applications. However, several other important features should be noted. They are (1) the potential of low pressure operation with high electron, ion, and other species densities, (2) separate control over the energy and flux of the ions and other species on the wafer, and (3) the potential of reducing surface and near surface damage. Higher low pressure ion, electron, and free radical densities are desirable. Measurements on the plasma disk reactor taken at low pressure ($5 \times 10^{-4} - 10^{-3}$ Torr) show plasma densities ($> 5 \times 10^{12} cm^{-3}$) are an order of magnitude higher than for systems reported by others, particularly the Suzuki et al references discussed in the prior art. Thus, it is believed that the microwave plasma disk reactor has correspondingly higher anisotropic etch rates.

In addition to the possibility of low pressure, high density operation, the microwave plasma reactor is attractive for etching because the wafer platform is independently biased. Since the platform is not an integral part of the plasma generation process (as opposed to conventional rf parallel plate reactors) the discharge electron, ion and reactive ion species densities can be adjusted by varying the input power and cavity tuning, while separately applied dc and/or rf voltages can be applied to the wafer 30 as is shown in FIG. 1. Thus this reactor has similarities to triode plasma and multipole plasma etching systems where energy and flux of the ions and reactive species can be controlled independently (or quasi-independently) without the presence of high voltages in the processing chamber. These systems have greater control over the type, number, and energy of the species incident on the substrate. The microwave disk reactor essentially offers a single electrode (the wafer) version of the triode system. However, it does not have the electrode (cathode) lifetime and contamination limitations and also should be able to operate at higher species concentrations.

As is shown in FIG. 5, the microwave plasma disk reactor can be configured for a reactive ion beam etching (RIBE). In this case, a colliminated beam of ions is drawn from the discharge and directed at the wafer. This microwave system would differ from other RIBE systems by the way the ions are produced. Most RIBE systems employ a Kaufman ion source, which produces a plasma with a dc discharge. The electrodeless microwave plasma ion source would not have the problem of short filament lifetime and electrode contamination problems associated with the Kaufman ion source. In addition, it can also be easily operated over a wider higher pressure ($10^{-4} - 10^{-2}$ Torr) range and at higher beam densities. Both of these features are expected to be advantages for etching applications.

Substrate surface damage is often a problem with conventional parallel plate rf reactors. This is because the applied rf voltage produces a large dc potential relative to the plasma. The microwave plasma disk reactor should have little or no microwave field adjacent to the substrate. Microwave excitation of the discharge occurs next to the quartz disk inside the reactor. The microwave fields adjacent to the wafer are small and can be minimized by pulling the substrate platform slightly out of the cavity and by TE mode cavity excitation causing the applied electric fields to be tangential to the plasma disk boundary. In that case, the fields adjacent to the wafer are the sheath fields plus any controllable, externally applied dc potential.

The reactor combines several important design principles. They are as follows:

(1) The formation of a thin disk shaped plasma adjacent to the wafers resulting in minimized total plasma surface area for a given plasma processing surface. Since discharge losses per utilized ion (or radical) are roughly proportional to the total surface area divided by the processing area, the disk shape, where the height is much less than the radius, is an efficient discharge configuration. It also provides a large flat surface, i.e. one end of the disk, for the placement of material to be processed by the plasma. The reactor is designed to allow quartz disks of different heights to be easily exchanged and thereby allows plasma discharges of different thickness (i.e. different discharge diffusion lengths) to be experimentally investigated.

(2) Plasma excitation inside a microwave cavity where the substrate platform forms part of the cavity walls (FIG. 4 or where a conducting grid or screen becomes part of the cavity (FIGS. 1 and 3).

(3) Either (a) single cavity mode excitation providing knowledge of the strength and geometry of the electromagnetic field patterns or (b) multimode plasma excitation that provides a spatially uniform plasma. The effect on processing of a change in direction of the electric field with respect to the gas flow and the plasma boundary, i.e. electric field parallel vs. perpendicular, can be assessed by changing exciting electromagnetic modes.

(4) Variable cavity length and coupling probe tuning that allows the discharge to be matched over a wide range of discharge pressures, powers and gaseous inputs. The match is accomplished without altering either the plasma shape or the applied electromagnetic field patterns and without losing microwave power in tuning stubs. Increases in input power increase the electric and magnetic field strengths, however the geometry of the field patterns stay essentially constant throughout the tuning process keeping the geometry of the fields exciting the plasma constant.

Thus the reactor can be tuned to a match as the experimental conditions, such as flow rate, pressure etc., change. This tuning provides another important practical function. Often a reactor will be used for a number of different applications resulting in the use of different materials, thicknesses, diameters and numbers of wafers to be processed. Each application will detune the cavity differently. However, a slight length tuning is all that is needed to compensate for the different processing loads.

(5) Radial input gas flow into the plasma zone.

(6) Separate temperature and dc voltage and current bias control of the wafer platform.

(7) A completely glass enclosed plasma source is possible by using a shadow shielded electron collector electrodes.

(8) Variable wafer position. The surface to be treated is placed on a platform or conducting screen that can be placed inside, at the edge of or outside the plasma zone as shown in FIG. 5. It will be appreciated that the platforms 31, 56, 60 or 71 can be and usually are adjustable in order to vary the position of the surface being treated relative to the plasma or beam.

(9) The concept can be scaled to large disk diameters of 50 cm or more by lowering the cavity resonant frequency to 915 MHz and by increasing the cylindrical cavity diameter. Thus, if desired, multiple piece or surface processing, as shown in FIG. 3, is possible.

(10) Magnetic field coils can be placed around the cavity to produce a longitudinal electron cyclotron resonant (or off resonant (Lisitano, G., M. Fontanesi and Sindoni, E., "Nonresonant Absorption of Electromagnetic Waves in a High Density Plasma," Appl. Phys. Lett., 16, 122-124 (1970)) magnetic field in the plasma if desired. In addition, a cusp, multipolar magnetic field layer produced by permanent magnets can be applied to reduce diffusion losses at low pressure.

(11) Plasma processing uniformity can be achieved by mechanically rotating the platform or by rotating the field patterns with a rotating metallic rod inside the cavity.

This reactor is very effectively used in the present invention with the proper biasing of the wafer to be treated as shown in FIGS. 1 to 5.

As will be apparent, there are numerous variations of the method and apparatus of the present invention. It is intended that these be included within the scope of the present invention.

We claim:

1. A method for treating a surface which comprises:
   (a) providing an ion generating apparatus including a plasma source employing a radio frequency, including UHF or microwave, wave coupler, which is metallic and in the shape of a hollow cavity and which is excited in one or more of its TE or TM modes of resonance and optionally including a static magnetic field surrounding the plasma source which aids in coupling at electron cyclotron resonance and aids in confining the ions in the coupler, wherein the plasma is maintained at a reduced pressure in operation, wherein the ion generating apparatus further includes an electrically insulated chamber (15) having a central longitudinal axis and mounted in closely spaced relationship to an area (16) of the coupler further includes a gas supply means (18,19) for providing a gas which is ionized to form the plasma in the insulated chamber, wherein the radio frequency wave applied to the coupler creates and then maintains the plasma in the shape of an elongate, thin plasma disk perpendicular to and surrounding the central axis in the chamber with a surface to be treated in position to receive the ions, further includes a movable metal plate means (12) in the hollow cavity mounted perpendicular to the axis and movable towards and away from the plasma disk, and further including a movable probe (14) connected to and extending inside the coupler for coupling the radio frequency waves to the coupler, wherein movement of the plate means and the probe in the coupler achieves a selected TE or TM mode of resonance of the radio frequency wave in the coupler and varies the resonance of the mode in order to treat the surface;
   (b) forming the plasma disk in the chamber; and
   (c) contacting the surface with the ions or free radicals inside the plasma or with ions or neutralized ions removed from the plasma which treat the surface.

2. The method of claim 1 wherein a material is deposited on the surface from the plasma.

3. The method of claim 2 wherein the material deposited is silicon from silane.

4. A method for treating a surface which comprises:
   (a) providing an ion generating apparatus, including a plasma source employing a radio frequency, including UHF and microwave, wave coupler which is metallic and in the shape of a hollow cavity and which is excited in one or more of its TE or TM modes of resonance and optionally including a static magnetic field surrounding the plasma source which aids in a coupling at electron cyclotron resonance and aids in confining the ions in the coupler, wherein the plasma in maintained at a reduced pressure in operation, wherein the ion source apparatus further includes an electrically insulated chamber (15) having a central longitudinal axis and mounted in closely spaced relationship to an area (16) of the coupler further includes a gas supply means (18,19) for providing a gas which is ionized to form the plasma in the insulated chamber, wherein the radio frequency wave applied to the coupler creates and then maintains the plasma in the shape of an elongate, thin plasma disk perpendicular to and surrounding the central axis in the chamber with a surface to be treated in position to receive the ions, further includes a movable metal plate means (12) in the hollow cavity mounted perpendicular to the axis and movable towards and away from the plasma disk, and further includes a movable probe (14) connected to and extending inside the coupler for coupling the radio frequency waves to the coupler, wherein movement of the plate means and the probe in the coupler achieves a selected TE or TM mode of resonance of the radio frequency wave in the coupler and varies the resonance of the mode in order to treat the surface;
   (b) forming the plasma disk in the chamber; and
   (c) attracting the ions to the surface with bias means having a suitable voltage potential attached to the surface so as to treat the surface with the ions.

5. The method of claim 4 wherein an ion attracting means (17a, 17b) is mounted adjacent the chamber and wherein the ions are accelerated by the ion attracting means outside of the chamber to impact on the surface.

6. The method of claim 4 wherein the surface (30) to be treated by the ions is provided on a platform (31, 34) mounted adjacent to the chamber and wherein the bias means is provided through the platform.

7. The method of claim 4 wherein the bias means is a wire and circuit (37, 38) biasing the surface to be treated with a voltage which attracts the ions.

8. The method of claim 7 wherein the surface to be treated is provided in the plasma disk.

9. The method of claim 4 wherein the surface is silicon or silicon dioxide in an integrated circuit which is treated by the attracted ions.

10. The method of claim 1 wherein the surface is etched by the ions, neutralized ions or free radicals.

11. The method of claim 1 wherein the gas is oxygen, the surface is oxidizable and wherein the surface is oxidized by oxygen ions formed in the plasma.

12. The method of claim 1 wherein the gas is a flourine containing molecule and the surface is silicon or silicon dioxide which is etched by the plasma.

13. The method of claim 12 wherein the fluorine containing molecule is $CF_4$.

14. The method of claim 13 wherein the $CF_4$ includes oxygen or hydrogen in an amount between about 10 and 20 volume percent.

15. The method of claim 1 wherein the gas is oxygen and wherein the surface is a Group III-V semiconductor which is oxidized by the ions.

16. The method of claim 15 wherein the semiconductor is indium phosphide.